US009605701B2

(12) United States Patent
Okamura et al.

(10) Patent No.: US 9,605,701 B2
(45) Date of Patent: Mar. 28, 2017

(54) FRONT SHEET FIXING STRUCTURE

(71) Applicant: FANUC CORPORATION, Yamanashi (JP)

(72) Inventors: Hideki Okamura, Yamanashi (JP); Kazuyuki Sasaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 261 days.

(21) Appl. No.: 13/947,505

(22) Filed: Jul. 22, 2013

(65) Prior Publication Data
US 2014/0023427 A1  Jan. 23, 2014

(30) Foreign Application Priority Data

Jul. 23, 2012 (JP) ................................ 2012-162658

(51) Int. Cl.
F16B 5/00 (2006.01)
F16B 5/12 (2006.01)
H05K 5/00 (2006.01)
H05K 5/02 (2006.01)
H05K 7/14 (2006.01)
G02F 1/1333 (2006.01)

(52) U.S. Cl.
CPC .......... F16B 5/12 (2013.01); G02F 1/133308 (2013.01); H05K 5/0017 (2013.01); H05K 5/02 (2013.01); H05K 7/1481 (2013.01); G02F 2001/13332 (2013.01); G02F 2203/60 (2013.01); Y10T 403/21 (2015.01)

(58) Field of Classification Search
CPC .. F16B 5/12; F16B 2001/0078; Y10T 403/21; G02F 2001/13332; G02F 2203/60; G02F 2001/133317; H05K 7/1481
See application file for complete search history.

(56) References Cited

U.S. PATENT DOCUMENTS 5,421,781 A * 6/1995 Mackellar ..................... 464/181
5,808,707 A * 9/1998 Niibori et al. .................. 349/60
6,292,239 B1 * 9/2001 Nagamura et al. ............. 349/58
(Continued)

FOREIGN PATENT DOCUMENTS

CN 1530711 A 9/2004
CN 1804693 A 7/2006
(Continued)

OTHER PUBLICATIONS

English language machine-generated translation of Japanese Patent Document JP 2007-293488, http://translationportal.epo.org, retreived from the internet Sep. 9, 2015.*
(Continued)

Primary Examiner — Daniel P Stodola
Assistant Examiner — Matthew R McMahon
(74) Attorney, Agent, or Firm — Hauptman Ham, LLP

(57) ABSTRACT

In a front sheet fixing structure configured to attach a front sheet to a housing having an opening for a display device or control panel, the front sheet is attached to an inner bottom surface of the housing so as to close the opening of the housing by means of a front metal plate having an opening corresponding to the opening of the housing and having a thermal expansion coefficient substantially equal to that of the front sheet.

4 Claims, 4 Drawing Sheets

(56) References Cited

U.S. PATENT DOCUMENTS

| | | | |
|---|---|---|---|
| 7,234,945 B2* | 6/2007 | Azuma | G02F 1/133308 349/150 |
| 8,081,268 B2* | 12/2011 | Zhang et al. | 349/59 |
| 8,446,543 B2* | 5/2013 | Teratani | G02F 1/133308 349/58 |
| 8,687,140 B2* | 4/2014 | Hung | G02F 1/133308 349/58 |
| 8,780,289 B2* | 7/2014 | Yu | G02F 1/133308 349/58 |
| 8,792,252 B2* | 7/2014 | Hwang et al. | 361/807 |
| 8,794,779 B2* | 8/2014 | Hayashi | 362/97.2 |
| 8,830,417 B2* | 9/2014 | Oohira | G02F 1/133308 349/12 |
| 2002/0100677 A1 | 8/2002 | Fukui et al. | |
| 2003/0184514 A1 | 10/2003 | Grosfeld et al. | |
| 2004/0095332 A1 | 5/2004 | Blanchard | |
| 2006/0152471 A1 | 7/2006 | Sugawara | |
| 2006/0209227 A1* | 9/2006 | Miyamoto | 349/58 |
| 2009/0011197 A1* | 1/2009 | Matsuhira | 428/192 |
| 2009/0153768 A1* | 6/2009 | Ooami | 349/58 |
| 2009/0289880 A1* | 11/2009 | Byoun et al. | 345/87 |
| 2010/0238373 A1 | 9/2010 | Kang et al. | |
| 2012/0162563 A1 | 6/2012 | Lai et al. | |
| 2012/0236541 A1* | 9/2012 | Chen | G02F 1/133308 362/97.2 |
| 2012/0242925 A1* | 9/2012 | Watanabe | 349/58 |
| 2013/0250500 A1 | 9/2013 | Tossavainen et al. | |
| 2014/0092339 A1* | 4/2014 | Yoshimura et al. | 349/58 |

FOREIGN PATENT DOCUMENTS

| | | |
|---|---|---|
| CN | 102122093 A | 7/2011 |
| DE | 3638407 A1 | 5/1988 |
| DE | 29712902 U1 | 9/1997 |
| DE | 69924090 T2 | 2/2006 |
| EP | 1017259 A2 | 7/2000 |
| JP | 200273277 A | 3/2002 |
| JP | 2002222055 A | 8/2002 |
| JP | 2003296023 A | 10/2003 |
| JP | 2005333290 A | 12/2005 |
| JP | 2007293488 A | 11/2007 |
| WO | 2012025783 A1 | 3/2012 |

OTHER PUBLICATIONS

Office Action dated Dec. 1, 2014, correponding to Chinese patent application No. 201310311237.7.
Office Action mailed Jan. 14, 2014, corresponds to Japanese patent application No. 2012-162658.
Decision to Grant a Patent mailed Apr. 22, 2014, corresponds Japanese patent application No. 2012-162658.
Office Action in DE Application No. 102013107702.1, dated Jun. 20, 2016.

* cited by examiner

FRONT SHEET FIXING STRUCTURE

RELATED APPLICATIONS

The present application is based on, and claims priority from, Japanese Application Number 2012-162658, filed Jul. 23, 2012, the disclosure of which is hereby incorporated by reference herein in its entirety.

BACKGROUND OF THE INVENTION

Field of the Invention

The present invention relates to a front sheet fixing structure for a front sheet to be attached to surfaces of a display device and control panel of a controller for controlling an industrial apparatus, such as a machine tool.

Description of the Related Art

A front sheet for protecting a touch panel, key switches, etc., from dust, oil, and water is attached to surfaces of a display screen and control panel. FIG. 6 shows a fixing structure configured to secure a front sheet 12 directly to a molded housing 10 using a double-sided adhesive tape.

As shown in FIG. 6, the front sheet 12 is affixed to the molded housing 10 with the double-sided adhesive tape so that it covers the entire operation surface of the housing 10. The front sheet consists mainly of a resin sheet (e.g., polyethylene terephthalate (PET) sheet) and is very low in rigidity. If the front sheet 12 is affixed directly to the molded housing 10, therefore, it may be wrinkled or deformed due to a difference in thermal expansion coefficient between the molded housing 10 and the front sheet 12, in case of change in temperature of the installation environment.

Japanese Patent Application Laid-Open No. 2007-293488 discloses an arrangement in which a metal frame is integrally molded with a resin bezel and the front sheet 12 is affixed to the metal frame so that it cannot be wrinkled or deformed.

Due to the difference in thermal expansion coefficient between the molded housing 10 and the front sheet 12 and the recent trend toward larger-screen displays, the front sheet 12 is liable to be wrinkled or deformed as a result of temperature change. In the aforementioned technique in which a metal frame is integrally molded with a resin bezel and a front sheet is affixed to the metal frame, processes of production are more complicated and costly than in a technique in which a front sheet of a simple resin molded product is affixed directly to a molded housing. Since the front sheet is flat, moreover, the design of the operation surface of a display device or control panel is inevitably flat, lacking three-dimensional distinction, if the entire operation surface is covered by the front sheet.

SUMMARY OF THE INVENTION

Accordingly, in view of the above problems of the prior art, the object of the present invention is to provide a front sheet fixing structure for a display device and control panel of a controller for controlling an industrial apparatus, such as a machine tool, configured so that deformation of a front sheet due to change in temperature of the installation environment can be prevented while maintaining a three-dimensional external appearance of a molded housing.

The present invention relates to a front sheet fixing structure configured to attach a front sheet to a housing comprising an opening for a display device or control panel. The front sheet is attached to an inner bottom surface of the housing so as to close the opening of the housing by means of a front metal plate comprising an opening corresponding to the opening of the housing and having a thermal expansion coefficient substantially equal to that of the front sheet.

The front metal plate may comprise a plate-like mounting portion and a plate-like portion, wherein the plate-like mounting portion has a frame-like mounting surface in contact with the inner bottom surface of the housing and the plate-like portion has a vertical surface perpendicular to the mounting surface and a plurality of oblong slots are formed in the plate-like portion, and the mounting surface of the mounting portion is affixed to a reverse surface of the housing with an adhesive or a double-sided tape. Further, the front sheet fixing structure may further comprise a fixing metal plate, which is a member with an L-shaped cross-section comprising a first part having a surface parallel to the inner bottom surface of the housing and a second part having a surface perpendicular to the inner bottom surface of the housing, such that the front metal plate is kept from moving in a direction perpendicular to the mounting surface of the mounting portion as lugs protruding from the second part are inserted into the slots of the plate-like portion of the front metal plate, and the first part is secured to the housing so that a gap for absorbing a dimensional difference between the second part and the vertical surface of the front metal plate is formed.

The front sheet may be affixed to the surface of the mounting portion of the front metal plate opposite to the frame-like mounting surface with an adhesive or a double-sided tape.

According to the present invention, there can be provided a front sheet fixing structure for a display device and control panel of a controller for controlling an industrial apparatus, such as a machine tool, configured so that deformation of a front sheet due to change in temperature of the installation environment can be prevented while maintaining a three-dimensional external appearance of a molded housing.

BRIEF DESCRIPTION OF THE DRAWINGS

The above and other objects and features of the present invention will be obvious from the ensuing description of embodiments with reference to the accompanying drawings, in which:

FIG. 6 is a view illustrating an outline of a prior art front sheet fixing structure configured to secure a front sheet directly to a molded housing with a double-sided tape or the like.

DETAILED DESCRIPTION OF THE PREFERRED EMBODIMENTS

According to the present invention, a front sheet is attached to a housing, which has an opening for a display device or control panel, by means of a front metal plate having an opening corresponding to the housing opening.

This front sheet is affixed to the inside of the housing so that it closes the housing opening from inside the housing.

Figure 1:
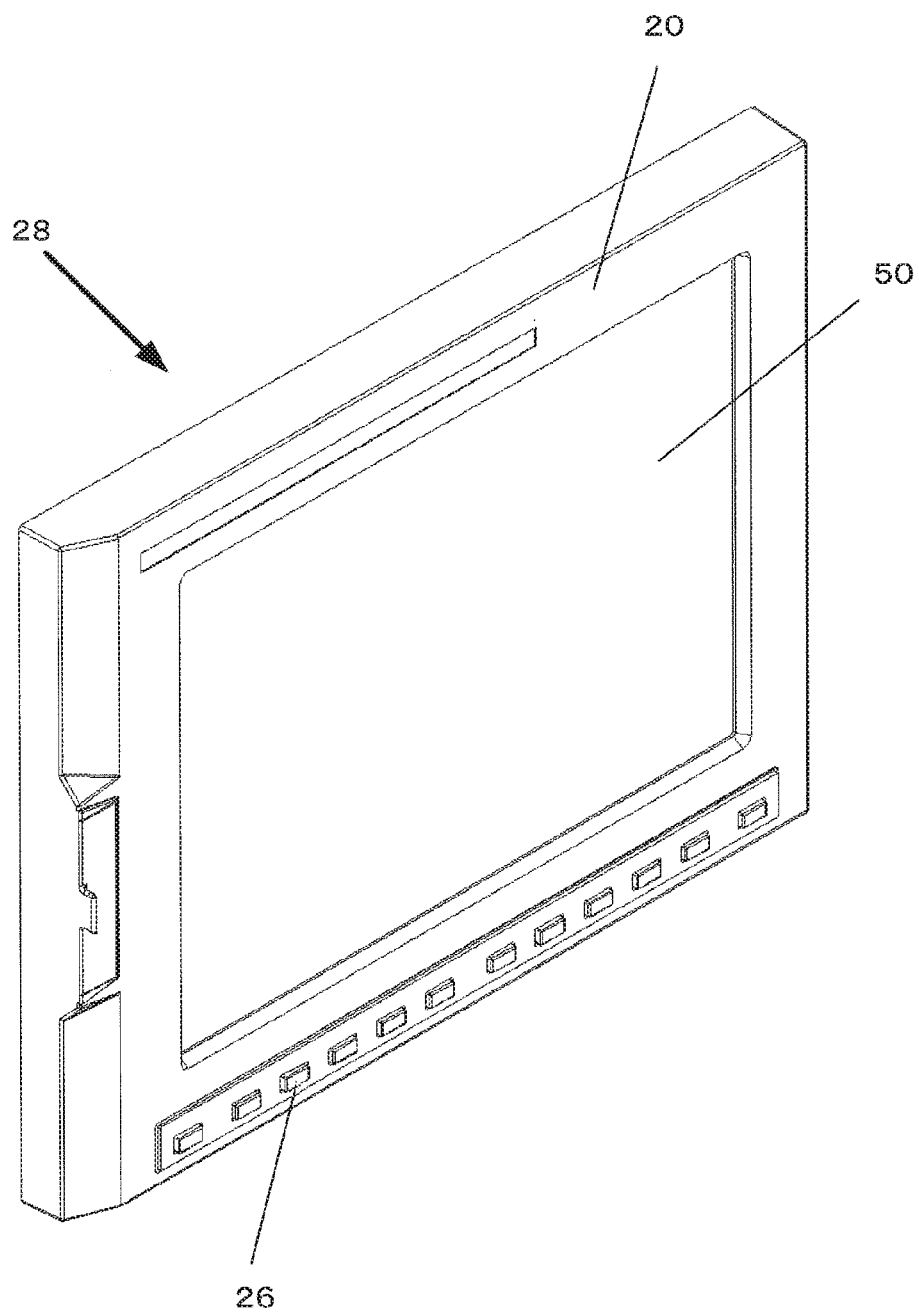
FIG. 1 is a view illustrating a display device to which one embodiment of a front sheet fixing structure according to the present invention is applied.
Figure 2:
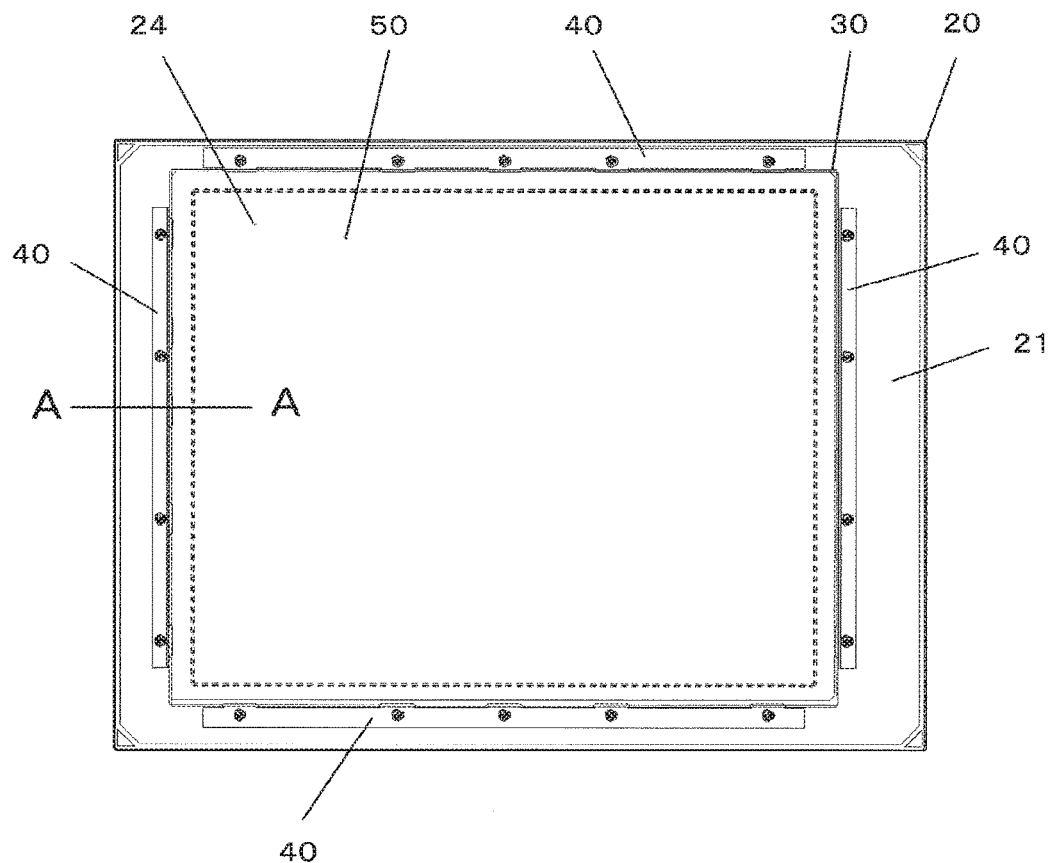
FIG. 2 is a view illustrating the front sheet fixing structure of FIG. 1.

If a non-rigid front sheet 50 is bonded directly to the reverse surface of a molded housing 20, as described above, it may be wrinkled or deformed due to differences in dimensional changes. According to the present invention, therefore, a rigid front metal plate 30 (FIG. 4) is bonded to the molded housing 20, and the front sheet 50 is attached to the molded housing 20 (more specifically, to the inside of the molded housing 20) with the front metal plate 30 between them, as shown in FIGS. 1 and 2.

Figure 4:
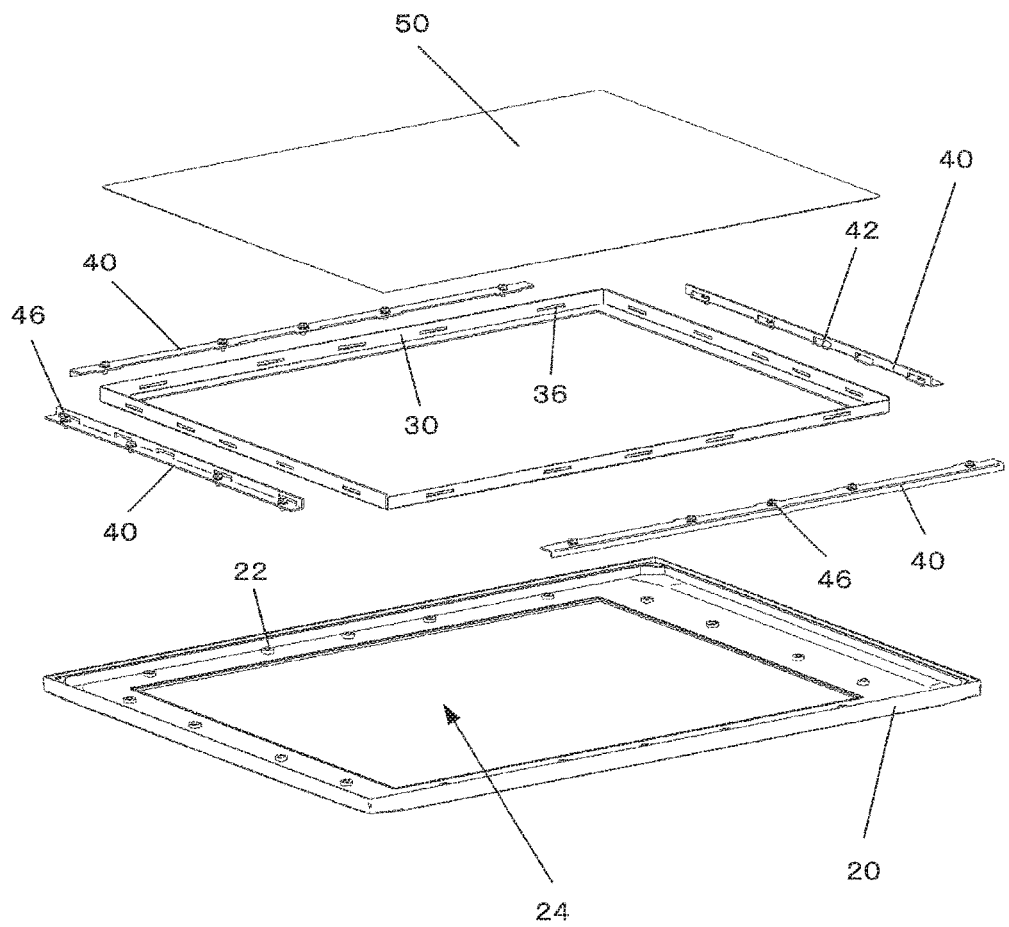
FIG. 4 is an exploded view illustrating a molded housing having the front sheet fixing structure shown in FIG. 2.

As shown in FIG. 4, the molded housing 20 has the form of a picture frame comprising a rectangular opening 24. The opening 24 covers a front part of a display device or manual data input (MDI) device attached to a controller of an industrial apparatus, such as a machine tool, which is to be visually recognized by a control panel operator, etc. The molded housing 20 is attached to a body housing (not shown) of the display device or control panel, which accommodates a mounted substrate. As shown in the display device 28 of FIG. 1, control buttons 26 are mounted on the lower part of the front surface of the molded housing 20.

Figure 3:
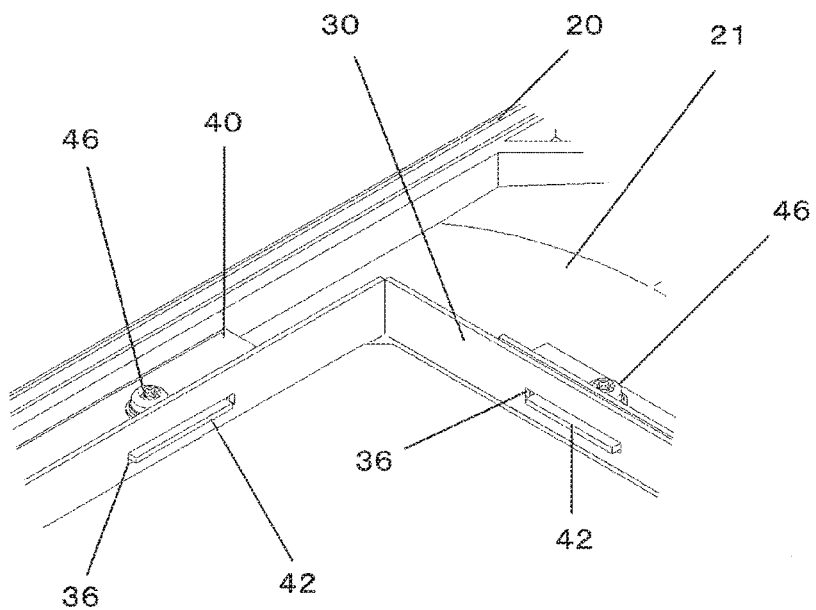
FIG. 3 is an enlarged perspective view illustrating a part of FIG. 1.
Figure 5:
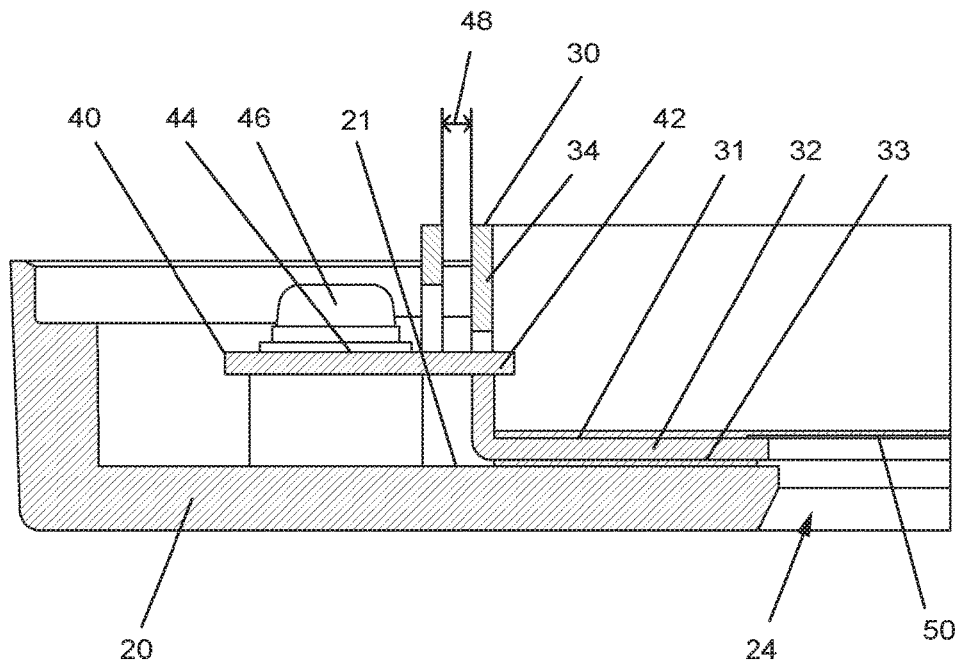
FIG. 5 is a sectional view taken along line A-A of FIG. 2.
Figure 6:
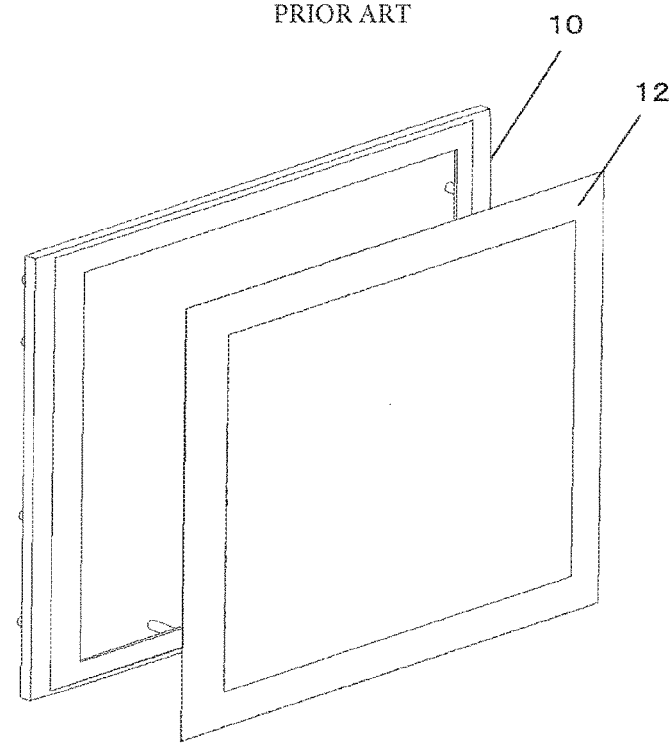

The front metal plate 30 is a rectangular frame-like structure comprising an opening corresponding to the rectangular opening 24 of the molded housing 20, as shown in FIG. 4. As shown in FIG. 5, the front metal plate 30 comprises a plate-like mounting portion 32 and a plate-like portion 34 rising perpendicularly from an end portion of the mounting portion 32. The mounting portion 32 has a frame-like mounting surface 33 in contact with an inner bottom surface 21 of the molded housing 20. On the other hand, the plate-like portion 34 has a vertical surface perpendicular to the mounting surface 33 of the mounting portion 32. As shown in FIG. 3, moreover, a plurality of oblong slots 36 are formed in the plate-like portion 34.

As shown in FIG. 5, the front sheet 50 is attached to an inner surface 31 of the mounting portion 32 of the front metal plate 30 with an adhesive or a double-sided tape. On the other hand, the mounting surface 33 of the mounting portion 32, having the front sheet 50 attached to its inner surface 31, is affixed to the inner bottom surface 21 of the molded housing 20 with an adhesive or a double-sided tape.

A stress-relief adhesive or double-sided tape should be used to bond the front metal plate 30 to the molded housing 20.

A fixing metal plate 40 is used to regulate movement of the front metal plate 30 in a direction perpendicular to the mounting surface 33 of the mounting portion 32. As shown in FIG. 4, the fixing metal plate 40 is an elongated member with an L-shaped cross-section, comprising a first part having a surface parallel to the inner bottom surface 21 of the molded housing 20 and a second part having a surface perpendicular to the inner bottom surface 21. A plurality of lugs 42 protrude from the second part (surface perpendicular to the inner bottom surface 21 of the molded housing 20) of the fixing metal plate 40. The lugs 42 are formed on the fixing metal plate 40 so that they can be inserted individually into the slots 36 of the front metal plate 30. When the lugs 42 are in the slots 36 of the front metal plate 30, the front metal plate 30 is kept from moving in a direction perpendicular to, and away from, the inner bottom surface 21 of the molded housing 20.

As shown in FIG. 5, a plurality of threaded holes 44 are formed in the first part (having the surface parallel to the inner bottom surface 21 of the molded housing 20) of the fixing metal plate 40. Also, as shown in FIG. 4, a plurality of threaded holes 22 are formed in the inner bottom surface 21 of the molded housing 20. With the lugs 42 of the fixing metal plate 40 inserted in the slots 36 of the front metal plate 30, moreover, screws 46 are screwed individually into the threaded holes 22 of the inner bottom surface 21 of the molded housing 20 through the threaded holes 44 of the fixing metal plate 40, as shown in FIGS. 3 and 5. In this way, the fixing metal plate 40 is secured to the molded housing 20.

The front sheet 50 is formed of a PET film or the like having a thermal expansion coefficient of about $2 \times 10^{-5}/°$ C., and thermal expansion coefficient of the front metal plate 30 is about $1.2 \times 10^{-5}/°$ C. Thus, the front sheet 50 and the front metal plate 30 have similar thermal expansion coefficients (or shrunk lengths). Since the front metal plate 30 secured to the molded housing 20, the size of which considerably changes depending on the temperature, is metallic and therefore more rigid than a resin sheet, it is not susceptible to the influence of the dimensional change of the molded housing 20. Thermal expansion coefficient of an ABS resin that is generally used for the molded housing 20 ranges from 6 to $13 \times 10^{-5}/°$ C., for example. The interposition of the front metal plate 30 makes thermal expansion or contraction of the molded housing 20 reluctant to be transferred to the front sheet 50 of PET. Thus, the occurrence of wrinkling or deformation due to temperature change of the installation environment can be prevented.

The front metal plate 30 to which the front sheet 50 is affixed is bonded to the inner bottom surface 21 of the molded housing 20 with an adhesive or a double-sided tape. Therefore, the molded housing 20 and the front metal plate 30 need not be integrally molded, so that a molded product can be obtained by a conventional manufacturing method. Further, the front metal plate 30 can be an effective reinforcement for the molded housing 20.

In securing the front metal plate 30 to the molded housing 20, on the other hand, these two elements with different thermal expansion coefficients are adhesively secured with the stress-relief adhesive or double-sided tape and mechanically secured by the fixing metal plate 40. As shown in FIG. 5, moreover, a gap 48 that absorbs dimensional change is provided between the front metal plate 30 and the fixing metal plate 40, whereby deformation can be reduced despite a greater dimensional change. This effect is enhanced in the case of a large unit, in particular.

The display device or control panel may be a general-purpose one provided for a controller of a machine tool or any of various industrial apparatuses or for various control apparatuses.

The invention claimed is:

1. A device, comprising:
a front sheet;
a housing comprising an opening for a display device or control panel; and
a front sheet fixing structure attaching the front sheet to the housing, wherein a front metal plate comprising an opening corresponding to the opening of the housing and having a thermal expansion coefficient substantially equal to that of the front sheet is secured to the housing on the side of an inner bottom surface of the housing via a stress-relief adhesive or a double-sided tape, and the front sheet is attached to the inner bottom surface of the housing so as to close the opening of the housing via the front metal plate; wherein:
the housing comprises a first wall and a second wall, wherein the inner bottom surface is formed on the first wall and the opening is bounded at least in part by the first wall, wherein the second wall is spaced away from the opening by the first wall, wherein the second wall forms a skirt such that the second wall extends upwards away from the first wall; wherein the front metal plate comprises a plate-like mounting portion having a frame-like mounting surface parallel to the inner bottom surface of the housing and a plate-like portion, projecting upwards away from the mounting portion, having a vertical surface perpendicular to the mounting surface and substantially parallel to the second wall of the housing;

the mounting surface of the mounting portion is affixed to the inner bottom surface of the housing with an adhesive or a double-sided tape; and wherein the front sheet fixing structure further comprises a fixing metal plate which includes a first part having a surface parallel to the inner bottom surface of the housing and a second part having a surface perpendicular to the inner bottom surface of the housing, such that the front metal plate is kept from moving in a direction perpendicular to the mounting surface of the mounting portion as lugs protruding from the second part are inserted into slots of the plate-like portion of the front metal plate, and the first part is secured to the housing so that a gap for absorbing a dimensional difference between the second part and the vertical surface of the front metal plate is formed.

2. The device according to claim 1, wherein the front sheet is affixed to the surface of the mounting portion of the front metal plate opposite to the frame-like mounting surface with an adhesive or a double-sided tape.

3. The device according to claim 1, wherein both the front sheet and the front metal plate are positioned inside of the housing.

4. The device according to claim 1, wherein the front sheet is formed of non-metallic materials.

\* \* \* \* \*